(12) United States Patent
Allard

(10) Patent No.: US 7,024,346 B1
(45) Date of Patent: Apr. 4, 2006

(54) AUTOMATIC ATAP TEST BENCH GENERATOR

(75) Inventor: Claire Allard, Montauroux (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/573,627

(22) Filed: May 17, 2000

(51) Int. Cl.
G06F 17/50 (2006.01)
G06F 11/00 (2006.01)

(52) U.S. Cl. .............. 703/14; 703/28; 714/30; 714/727; 714/733; 714/734; 714/741

(58) Field of Classification Search ........... 714/741, 714/30, 733, 744, 727, 726; 703/14
See application file for complete search history.

(56) References Cited

U.S. PATENT DOCUMENTS

| | | | | |
|---|---|---|---|---|
| 4,809,170 | A | 2/1989 | Leblang et al. | 364/200 |
| 5,517,637 | A * | 5/1996 | Bruce et al. | 703/15 |
| 5,630,132 | A | 5/1997 | Allran et al. | 395/670 |
| 5,691,973 | A | 11/1997 | Ramström et al. | 370/58.2 |
| 5,768,159 | A | 6/1998 | Belkadi et al. | 364/578 |
| 5,805,802 | A | 9/1998 | Marx | 395/188.01 |
| 5,842,013 | A | 11/1998 | Kopp | 395/670 |
| 5,870,308 | A | 2/1999 | Dangelo et al. | 364/489 |
| 6,353,904 | B1 * | 3/2002 | Le | 714/726 |

OTHER PUBLICATIONS

IEEE Standard for a Mixed–Signal Test Bus, IEEE Std 1149.1–1990, Published Feb. 15, 1990 pp. i–xvii, 1–1 to 1–5, 2–1 to 2–6, 3–1 to 3–5.*

Guo–Hun Zhu, Xuelong Yan, Ya Zhou and YueRen Guo, "The Algorithms of Inserting Boundary–Scan Circuit Automatically", IEEE, 1998, pp. 527–531.*

IEEE Standard for a Mixed–Signal Test Bus, IEEE Std 1149.4–1999, Published Mar. 28, 2000, pp. i–iii, 1–78.*

* cited by examiner

Primary Examiner—W. Thomson
Assistant Examiner—Dwin M. Craig
(74) Attorney, Agent, or Firm—Michael J. Ure

(57) ABSTRACT

A system is provided for automatically generating ATAP test solutions. The system includes ATAP simulation circuitry, a bus, an ATAP test bench file, an output file, and a test program. The ATAP simulation circuitry is switchably coupled to a selected analog cell having an ATAP for applying analog tests. The bus is coupled with the ATAP simulation. The bus is operative to transmit and receive analog test simulation data. The ATAP test bench file is configured to receive the simulation data. The output file is operative to store the simulation data and deliver the simulation data to the ATAP simulation circuitry. The test program is generated by the ATAP simulation circuitry in the output file. The test program is configured to automatically generate ATAP test benches based upon chip-specific information. A method is also provided.

21 Claims, 4 Drawing Sheets

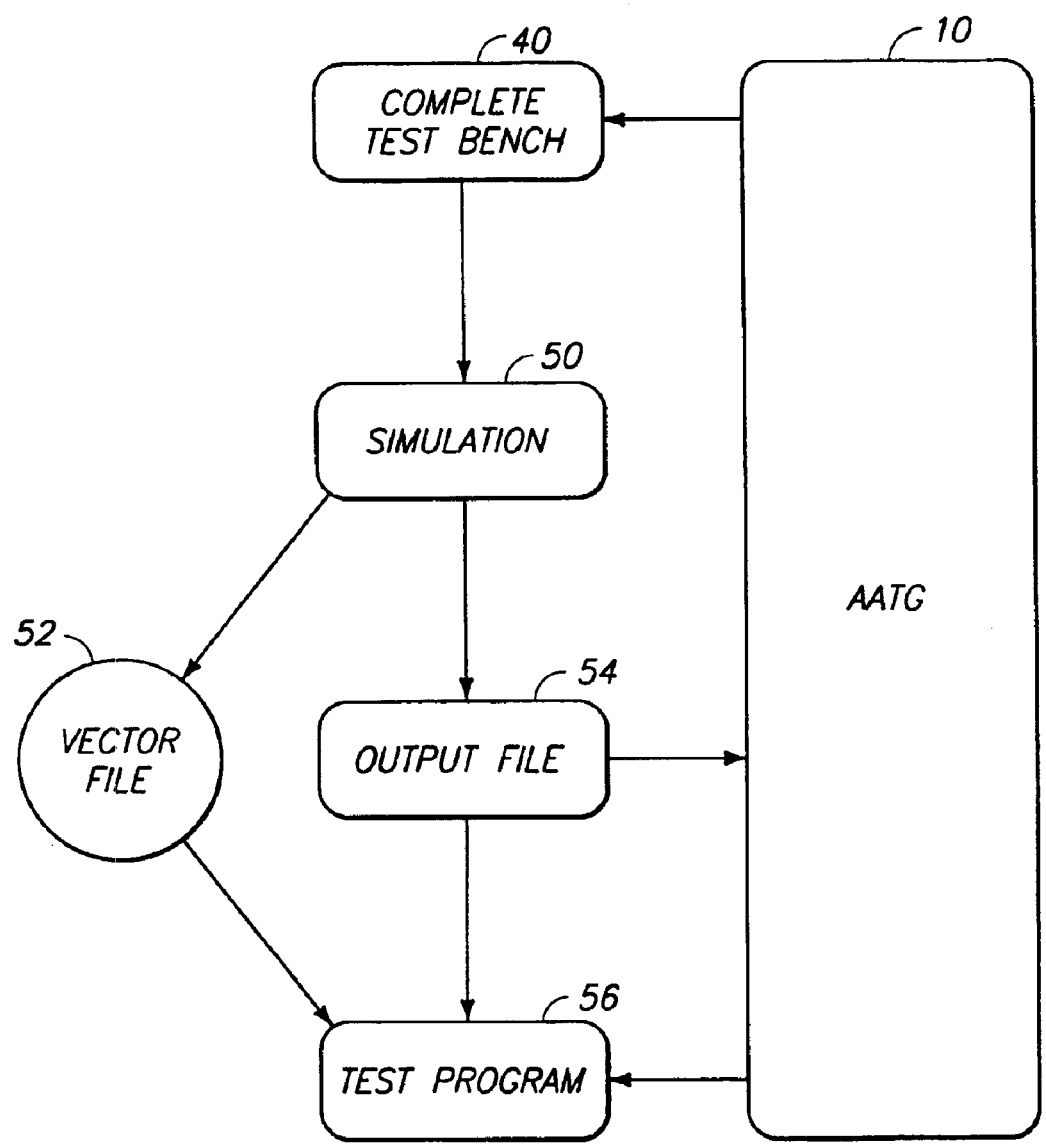

AUTOMATIC ATAP TEST BENCH GENERATOR

TECHNICAL FIELD

This invention relates to the simulation of integrated circuits, and more particularly, to the generation of test benches for validating analog test access port (ATAP) connections of analog cells present within an integrated circuit.

BACKGROUND OF THE INVENTION

A number of different design methodologies are known which enable a user to efficiently synthesize logic circuits. For example, one technique uses VHDL code to synthesize, or generate, efficient logic circuits. Another technique uses Verilog to synthesize efficient logic circuits.

VHDL refers to VHSIC Hardware Description Language. VHDL is a hardware description language (HDL) that is used to design electronic systems at the system, board and component levels. VHDL enables the development of models using a very high level of abstraction. Although VHDL was initially conceived as a documentation language, the language is presently used principally to perform simulation and logic synthesis operations. Although VHDL was originally developed for the Unites States military VHSIC program, VHDL is now identified as an Institute of Electrical and Electronics Engineers (IEEE) standard. VHSIC refers to Very High Speed Integrated Circuit, which is a category of ultra-high-speed chips that employ LSI and VLSI technologies.

Verilog refers to a hardware description language (HDL) that is used to design electronic systems at the system, board and component levels. Although originally developed by Cadence Design Systems, Inc., of San Jose, Calif., Verilog is now an IEEE standard that is a de facto standard for proprietary HDLs.

VHDL and programmable logic design process implementations include the creation of design descriptions, and involve synthesis, placement and routing of integrated circuits, as well as the creation of test benches in order to verify generated designs.

A test branch, sometimes referred to as a test fixture, is a simulation model that is used to verify a design's functionality. The test bench allows application of input test vectors to a design entity (such as an integration circuit under test), and verifies output of the simulation model. A test bench can be used to simulate a pre-synthesis design description, or a post-layout design description.

The ability to provide an integrated circuit, wherein an entire system is provided on a single chip, greatly complicates testing of the chip. The ability to implement design-for-test techniques becomes especially important when an entire system is designed onto a single, common chip. Accordingly, the ability to efficient and effectively test a chip is very important. Typically, system-on-a-chip designs utilize reusable cores, or cells. Use of these cells has further complicated the ability to test a chip because, until recently, core-based design-for-test (DFT) and "testability" efforts have been directed almost exclusively to use with digital chips. However, the implementation of full system-on-a-chip designs has lead to designs that also include analog block or cells These chips are referred to as "mixed-signal" chips. Traditional test bench designs have not been able to efficiently and effectively test such "mixed-signal" chips.

Recent efforts are being directed in order to provide some limited success when testing "mixed-signal" chips. For example, IEEE P1149.4 Mixed-Signal Test-Bus Working Group is presently designing a standard as an extension of a well-known 1149.1 boundary-scan standard to include on-chip analog structures. See Cron, Adam, "IEEE P1149.4—Almost a Standard," 1997 International Test Conference Proceedings, Nov. 3–7, 1997, p. 174 IEEE P1149.4 will be configured to use a six-wire bus to measure analog signals. Four conductive lines of the bus correspond to the four lines presently used by the IEEE existing 1149.1 bus at the test-access port (TAP). Two additional wires cooperate to provide an analog stimulus-and-response bus, referred to as analog TAP. This analog TAP bus connects with analog test equipment, such as analog components of a chip.

One technique recently realized for testing "mixed-signal" chips was introduced by Logic Version, of San Jose, Calif., and involves a technique for testing embedded analog cores with small built-in self test (BIST) blocks that comprise synthesizable Verilog or VHDL code. By placing these blocks on a mixed-signal chip, a way is provided to digitally test analog cores while sometimes eliminating any need for analog test equipment. However, separate analog test equipment is still needed in many cases. Furthermore, iterative testing still remains complicated and time-consuming.

Another technique using analog and mixed-signal DFT and testability tools is provided by OpMaxx, Inc., of Beaverton, Oreg., sold under the trade name of Design-Maxx. DesignMaxx is provided for measuring analog circuit sensitivity to direct current (DC), alternating current (AC) and transient simulation. One component is tailored for analog fault-coverage analysis, and another component is tailored for generating analog tests and detecting hard and soft faults in analog circuits. However, OpMaxx may not be able to handle all chips containing embedded mixed-signal cores. Additional details of OpMaxx are available from Arabi, Karim and B. Kaminska, "Oscillation Build-In Self Test (OBIST) for Functional Structural Testing of Analog and Mixed-Signal Integrated Circuits," 1997 International Test Conference Proceedings, November 3–5, 1997, P. 768.

Yet another technique for testing analog cells embedded in mixed-signal products is provided by Philips Semiconductors, of Sophia Antipolis, Valbonne, France. An Analog Test Access Port (ATAP) is provided such that the testing of analog cells is made independent of the logic circuitry around which each analog cell is embedded. The Analog Test Access Port (ATAP) is an auxiliary port implemented at an analog cell level that provides access to all the cell's digital I/O's, such as Clock, Reset, Data Pins, configuration bits, etc., when the cell is set into a dedicated analog test mode. Details of such Analog Test Access Port (ATAP) are disclosed in Applicant's U.S. Pat. application Ser. No. 09/109,848, filed Jul. 2, 1998, entitled "Analog Test Access Port and Method Transfer", and incorporated herein by reference.

For integrated circuits (ICs) containing analog and mixed signal cells, all the analog and mixed signal cells that contain ATAP should be tested using the ATAP protocol. In order to ensure that the cells within the IC are well connected, a simulation should be run before testing the IC. The simulation consists mainly in writing values into the ATAP registers in order to set the cell into a defined status. When the simulation is done, measurements can be made. Accordingly, a series of successive write operations are made which depend on the cell. For each IC containing cells with ATAP, the signal names are different and manually wrting a test bench requires a considerable amount of effort and time.

In the past, analog test access port (ATAP) test benches have been used to test for interconnection between circuits.

These test benches were very basic since they were written by hand. Therefore, there was a relatively high risk of errors in the instructions and a non-negligible time was need to debug the design.

Therefore, there exists a need to provide an improved apparatus and method for generating test benches, and for improving test program generation.

SUMMARY OF THE INVENTION

An apparatus and method provide a test interface, in the form of a debug interfere, that is provided for rendering ATAP simulation in order to validate ATAP connections for all analog cells within an analog or mixed analog/digital integrated circuit. A complete test bench is generated, and verification of the output file contains important parameters which are extracted from the simulation.

According to one aspect, a system is provided for automatically generating ATAP test solutions. The system includes ATAP simulation circuitry, a bus, an ATAP test bench file, an output file, and a test program. The ATAP simulation circuitry is switchably coupled to a selected analog cell having an ATAP for applying analog tests. The bus is coupled with the ATAP simulation circuitry. The bus is operative to transmit and receive analog test simulation data. The ATAP test bench file is configured to receive the simulation data. The output file is operative to store the simulation data and deliver the simulation data to the ATAP simulation circuitry. The test program is generated by the ATAP simulation circuitry in the output file. The test program is configured to automatically ATAP test benches based upon chip-specific information.

According to another aspect, an apparatus is provided for generating a test program for analog components of an integrated circuit (IC). The apparatus includes ATAP simulation circuitry, a bus, an ATAP test bench, an output file, and a test program. The ATAP simulation circuitry is switchably coupled to a selected analog cell for applying analog tests. The bus to coupled with the ATAP simulation circuitry. The bus is operative is transmit and receive analog test simulation data. The ATAP test bench is configured to receive the simulation data. The output file is operative to store results of the simulation and deliver the results to the ATAP simulation circuitry. The test program is generated by the ATAP simulation circuitry in the output file. The test program is configured to automatically generate ATAP test benches based upon chip-specific information.

According to yet another aspect, a method is provided for generating a test bench. The method includes the steps of: providing an integrated circuit (IC) having a cell containing an analog component and including an ATAP, providing an AATG having at least one default cell; loading a cross-reference file; selecting tests required for cells in the cross-reference file by default; and generating a test bench.

According to even another aspect, a method is provided for automatically generating analog cell test solutions for mixed signal products. The method includes the following steps: providing an integrated circuit having an analog cell; providing an AATG; providing a database of default cells including ATAP pin names; selecting a default cell from the database; coupling together a plurality of the selected cells into a series chain; identifying any ATAP pin names that are different from any pin names identified within the series chain of selected cells; selecting tests required for each selected cell; and filling an option panel with the selected cells and tests.

One advantage is that a test bench no longer needs to be written by hand. Another advantage is that the time and effort needed to write a new test program is greatly reduce. Yet another advantage is that an existing test program can be easily reused which also significantly reduces time and effort.

BRIEF DESCRIPTION OF THE DRAWINGS

Preferred embodiments of the invention are described below with reference to the following accompanying drawings.

FIG. 4 is a block diagram of a simulation for a mixed-signal chip having at least one analog cell using the debug interface of an AATG according to the present invention.

DETAILED DESCRIPTION OF THE PREFERRED EMBODIMENTS

This disclosure of the invention is submitted in furthermore of the constitutional purposes of the U.S. Patent Laws "to promote the progress of science and useful arts" (Article 1, Section 8).

Reference will now be made to a preferred embodiment of Applicant's invention. One exemplary implementation is described below and depicted with reference to the drawings comprising an apparatus and method for generating test benches. While the invention is described via a preferred embodiment, it is understood that the description is not intended to limit the invention to this embodiment, but is intended to cover alternatives, equivalents, and modifications such as are included within the scope of the appended claims.

In an effort to prevent obscuring the invention at hand, only details germane to implementing the invention will be described in great detail, with presently understood peripheral details being incorporated by reference as being presently understood in the art.

Figure 1:
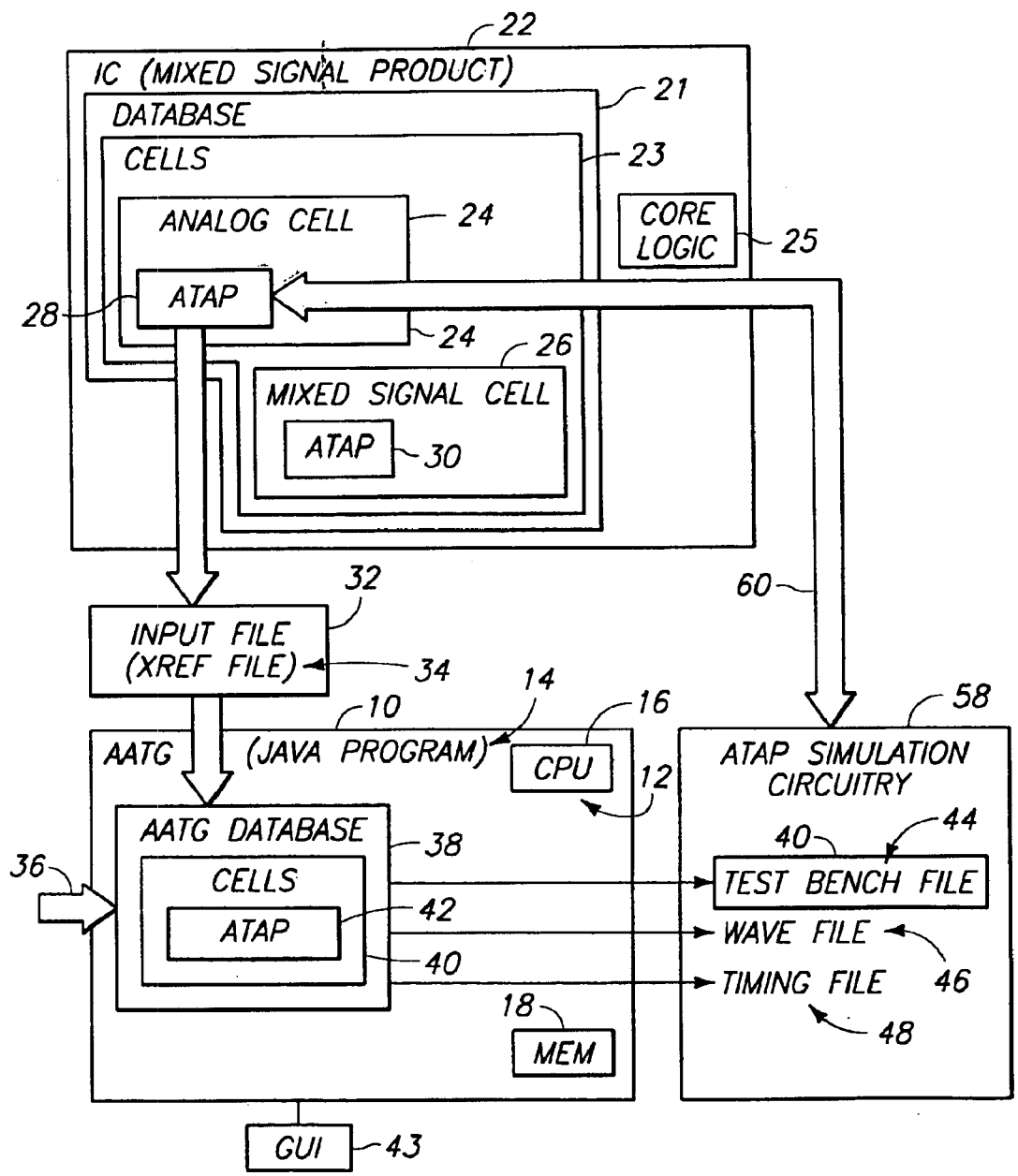
FIG. 1 is a block diagram of an automatic ATAP test bench generator (AATG) according to one implementation of the present invention.

FIG. 1 illustrates an automatic ATAP test bench generator (AATG) identified generally by reference numeral 10. According to one construction, generator 10 is implemented on processing circuitry 12 as a Java program 14. Java is a programming language for Internet (World Wide Web) and intranet applications from Sun Microsystems, Inc., of Mountain View, Calif. In one case, processing circuitry 12 is provided by a central processing unit (CPU) 16. Java program 14 is stored in memory 18, and is implemented via CPU 16.

Generator 10 is used to generate test branch files 44 that help generate a test bench program for an integrated circuit (IC) 22 that has at least one of an analog cell 24 or a mixed signal cell 26, wherein analog cells 24 and/or mixed signal cells 26 contain an analog test access port (ATAP) 28 and 30, respectively. A mixed signal cell 26 contains a combination of analog components and digital components with the analog components each being provided with an analog test access port (ATAP) 30.

For purpose of describing one implementation of the invention, ATAP 28 will be referred to in conjunction with analog cell 24 to teach the invention. However, it is understood that ATAP 30 and mixed signal cell 26 can also benefit from implementation of Applicant's invention.

As shown in FIG. 1, an integrated circuit (IC), or chip, 22 is presented for testing in order to validate that the ATAP connections have been properly made for all of the cells 23 of a database 21 that contain analog components, such as analog cell 24 and mixed signal cell 26. In other words, a test bench file 44 is rendered for any analog cell embedded in a mixed signal IC 22 which is completely independent of core logic 25 of IC 22.

An input file 32, in the form of a cross-reference file 34, is received from ATAP 28 by AATG 10 prior to generating a test bench 40 for IC 22. Test bench 40 is understood to comprise one or more test bench files 44. Additionally or optionally, an input data file 36 is delivered to an AATG database 38. AATG database 38 includes one or more cells 40, each containing an ATAP 42. AATG 10 generates a test bench 40 comprising test bench file 44. AATG 10 also generates a wave file 46 and a timing file 48.

Test bench 40, wave file 46 and timing file 48 are delivered within ATAP simulation circuitry 58. Also according to one construction, a graphical user interface 43 communicates with CPU 16 of AATG 10. A bus 60 interconnects ATAP simulation circuitry 58 with each ATAP 28 present within specific analog cells within IC 22.

AATG 10 cooperates with ATAP simulation circuitry 58 to provide a system for automatically generating ATAP test solutions. ATAP simulation circuitry 58 is switchably coupled to a selected analog cell 24 in order to apply analog tests. Bus 60 is coupled between ATAP simulation circuitry 58 and cell 24, and is operative to transmit and receive analog test simulation data. ATAP test bench 40 is configured to receive the simulation data. Output file, or test bench file, 44 is operative to store results of the simulation and deliver the results to ATAP simulation circuitry 58. ATAP simulation circuitry 58 cooperates with test bench file 44 to generate a test program. The test program is configured to automatically generate ATAP test benches based upon chip-specific information. In other words, ATAP test benches are generated automatically dependent only on information that differs from one chip to another.

AATG 10 is provided for the purpose of generating a test bench 40 that is used when performing ATAP simulation. Test bench 40 can be generated for a single cell 24 or 26, or for an entire chip, or IC, 22. In operation, AATG 10 can use database 38, wherein all the possible cells are resident within database 38. Input file 32, and more particularly, cross-reference (XREF) file 34, is also used by AATG 10 during generation of test bench 40 for IC 22.

According to one implementation, test bench 40 can be generated in Verilog. According to another implementation, test bench 40 can be generated in VHDL language. According to test bench 40, verification of output signals is implemented, and test bench output file 44 is generated. Output file 44 contains all the simulation results and timing information that is useful for testing IC 22.

Pursuant to this invention, ATAP test benches 40 can be generated more quickly and with less effort. By reviewing the contents of output file 44, the simulation results can be verified nearly immediately. AATG 10 enables the generation for a chip designer of a complete test bench 40, wherein test bench 40 checks cell functionality for all possible configurations, and also checks for correct use of the cell within a chip design. All resulting simulation results are stocked in the output file, such that debug time is significantly reduced. Such a repetitive approach to simulation allows for program re-use, and reduces test program development time from approximately 3 months to less than one week, for a typical design.

AATG 10 is configured to be independent of customer flow. For example, AATG 10 supports both Verilog and VHDL. An additional benefit of AATG 10 is that test program generation time is greatly improved because all the missing parameters for the test program are embedded in output file 44. Since AATG 10 is a Java program 14, AATG 10 is independent of the platform on which AATG 10 is running.

Furthermore, ATAP 28 is a test interface which is used in analog cells in order to test such analog cells completely independently of the rest of the integrated circuit (IC) 22. AATG 10 generates test benches 40 to validate the ATAP connections of all the analog cells.

Figure 2:
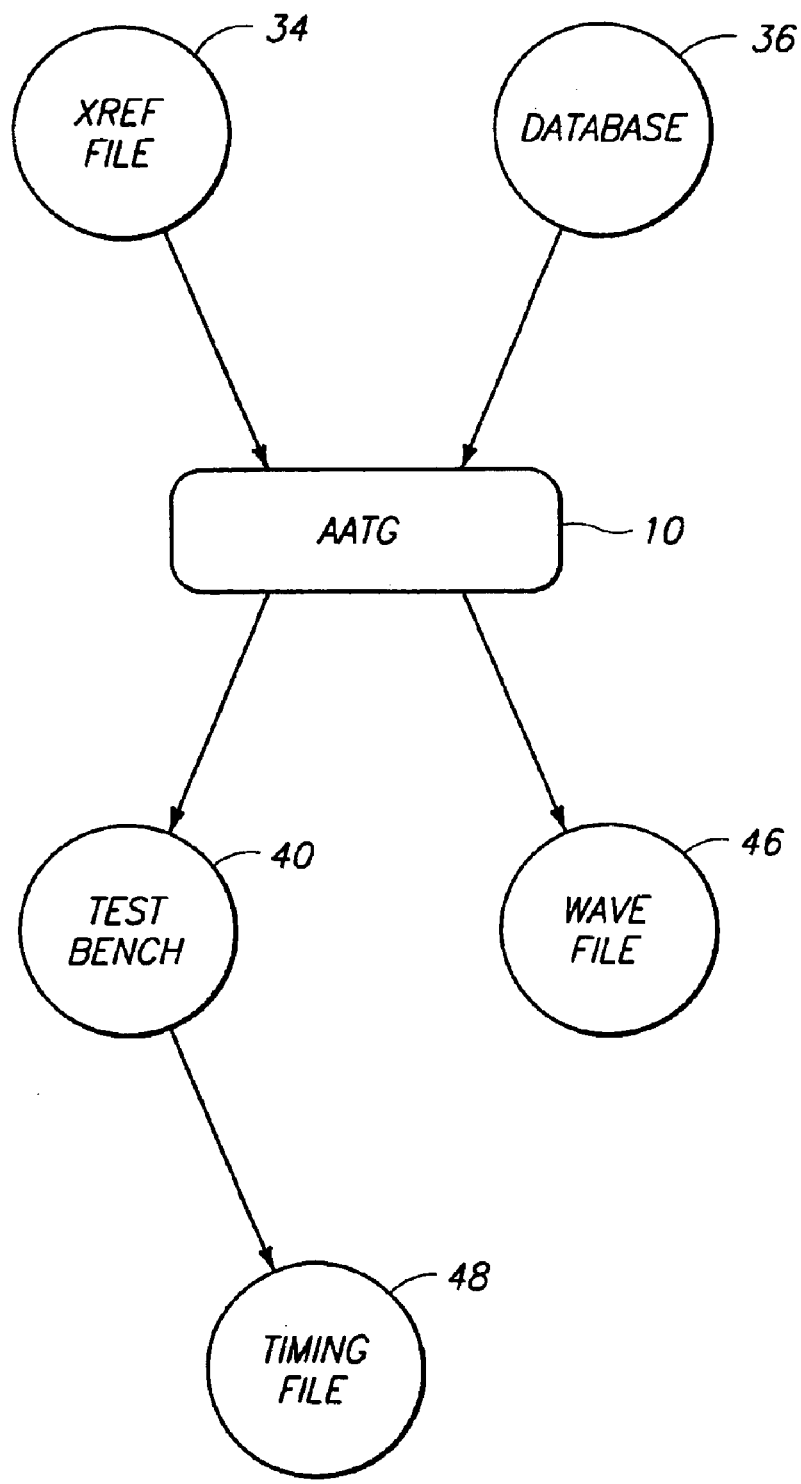
FIG. 2 is a block diagram of a debug interface for ATAP simulations using an automatic ATAP test bench generator (AATG).

FIG. 2 illustrates a debug interface for ATAP simulations using the automatic ATAP test bench generator (AATG) 10 of FIG. 1. Two possible inputs are provided to AATG 10; namely, cross-reference (XREF) file 34 and database file 36. Additionally, three outputs are provided from AATG 10: namely, test bench file 40, wave file 46, and timing file 48. The cross-reference (XREF) file 34 contains all the characteristics of a design which are needed for the simulation. The information includes, for example, a pin name that is provided at a top level to apply vectors, and the simulation language. The database file, or datafile, 36 contains at least all the cells of the design, and the related tests that are needed for each cell. The test bench file 44 contains all the vectors and instructions. The vectors are configured in a special format that is compatible with either VHDL or Verilog, depending on the ATAP protocol being used. The instructions are configured to indicate the current time when measurement should be done. The wave file contains a list of waves to be checked. The timing file contains all the timing information required for test program reuse, and is generated during the simulation process. The cross-reference file will be updated with this file.

Pursuant to the debug interface of AATG, AATG is a Java program that is independent of the platform where AATG is running. Graphical user interface 43 is generated in a window that is implemented via CPU 16 within a window program. Five different panels are presented via interface 43 including: a presentation panel; a test panel; a pin panel; a custom panel; and an options panel. The presentation panel shows one layout that presents layout and results. The test panel shows all the tests that are available for a particular cell. Each test can be enabled or disabled depending on the test that is needed. The pin panel contains all of the ATAP pins and their equivalent signal names, for the chip or cell being tested. The custom panel allows a user to generate a bench with selected cells and without the cross-reference file. The options panel contains all the information that relates to a simulation, and the output file names are listed in this panel.

Figure 3:
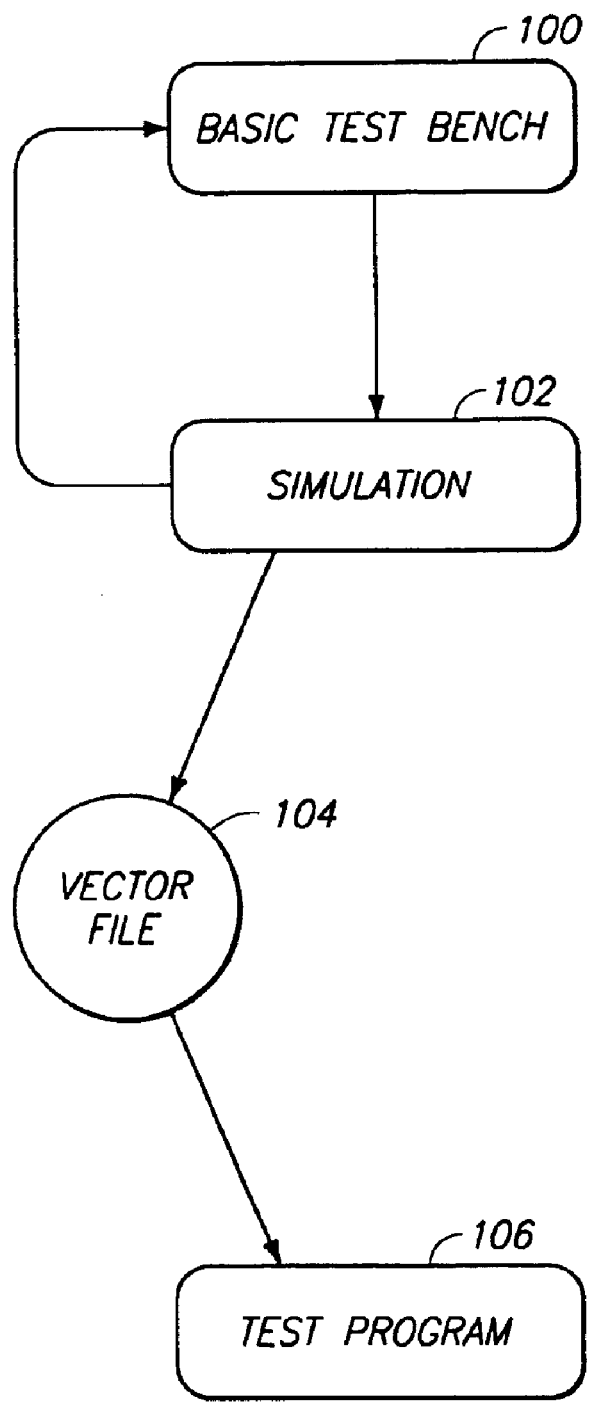
FIG. 3 is a block diagram of a prior art implementation of a simulation for a mixed-signal chip having at least one analog cell using a basic test bench.

FIG. 3 illustrates a prior art implementation of a simulation for a mixed-signal chip having at least one analog cell using a basic test bench. According to prior art techniques, ATAP test benches were written by hand and were relatively basic in complexity. As a result, there was a relatively high risk that errors would be generated in the instructions, and it took a non-negligible time to debug the integrated circuit. More particularly, a prior art simulation 102 generates and uses a basic test bench 100 in order to generate an output file in the form of a vector file 104. Vector file 104 is input into a test program 106.

One problem with the prior art simulation technique results because it typically takes at least one day to write a basic test bench 100. Additionally, it typically takes at least one week to debug the simulation program 102. Finally, it typically takes two or three months to write the test program 106. Even worse, after writing test program 106 for a specific vector file 104, test program 106 is only usable for a specific instance, and cannot be reused, but must instead be regenerated via a new vector file 104. In contrast, the present invention overcomes these problems as discussed below with reference to FIG. 4.

FIG. 4 illustrates a simulation for a mixed-signal chip having at least one analog cell and using the debug interface of an AATG according to the present invention. More particularly, a complete test bench 40 is generated using AATG 10. Test bench 40 is used to generate a simulation program 50. Simulation program 50 implements a simulation of the analog components present within an integrated circuit that has been proposed for testing. Simulation program 50 generates a vector file 52 and an output file 54. Vector file 52 and output file 54 form inputs to a test program 56. Output file 54 also forms an input to AATG 10. Additionally, AATG 10 provides an input to test program 56.

Advantages over the prior art simulation techniques of FIG. 3 are that it only takes approximately a quarter of an hour to generate test bench 40 using AATG 10. Additionally, it typically takes at most two days to debug simulation program 50. Furthermore, it typically takes less than a week to write a new test program 56. In addition, it typically takes at most a day in order to re-format test program 56 for reuse in order to perform a new simulation. Complete test bench 40 generates a single vector file 52, and simulation results from running simulation program 50 are stored in output file 54 which is made accessible to AATG 10 and test program 56.

Database 36 (see FIG. 2) for AATG 10 of FIG. 4 contains all the desired cells that are to be used by a design and test person when generating a test bench and performing a simulation. According to one exemplary implementation database 36 will contain a complete set of VLSI WCT Sophia cells, available from Philips Semiconductor of Sophia Antipolis, Valbonne, France, where a test bench and simulation are being generated and performed. However, it is understood that a complete set of another type of cells can be provided when generating a test bench and performing a simulation.

The format of database 36 enables a designer to add a new cell with relative ease, and to modify existing cells. However, the addition of a new cell requires that an associated set of different tests also be provided. Using Applicant's invention, these tests are composed using basic functions which enables reuse of these basic functions when creating new tests.

Pursuant to Applicant's invention, there exist two primary techniques for generating test bench 40 (see FIG. 2). One technique involves using cross-reference (XREF) file 34. The other technique involves using only database 36. Another technique is also possible wherein AATG is used to generate a mask command when using the Vifman tool available from COMPASS Design Automation, Inc., formerly a subsidiary of VLSI Technology, Inc., of San Jose, Calif., and now integrated into Avant! Corporation, of Fremont, Calif. This third option enables relatively easy modification when generating a mask for other tools because the technique is based on using an input file former which is conductive to reuse.

In order to generate a test bench with a cross-reference file, the cross-reference file is filled by a designer, with its format being fixed. The cross-reference file contains information on simulation parameters, ATAP signal names, and analog pins. The following steps can be used in order to generate a test bench. First, the cross-reference file is loaded. Secondly, the options panel is modified if the defaults file names do not fit. Thirdly, the tests that are required are selected by default. Finally, the test bench is generated.

In order to generate a test bench without using a cross-reference file, the following steps can be used. First, a designer chooses the cells solely from a database, then chooses the order in which the cells are chained together. Secondly, any ATAP pin names that are different from the default pin names are modified. Thirdly, the required tests are selected by default. Finally, the option panel is filled.

The third option is to generate a mask command. Once a simulation has been successfully run for an integrated circuit (IC), or chip, a designer has to generate masks for the VIF file. The VIF file becomes the basis for generating the test program. In order to avoid failure during test, some output signals need to be masked. In order to realize this generation, AATG uses the output file 54 that is created during the simulation (via simulation program 50) by the test bench 56.

In compliance with the statute, the invention has been described in language more or less specific as to structural and methodical features. It is to be understood, however, that the invention is not limited to the specific features shown and described, since the means herein disclosed comprises preferred forms of putting the invention into effect. The invention is, therefore, claimed in any of its forms or modifications within the proper scope of the appended claims appropriately interpreted in accordance with the doctrine of equivalents.

In the claims:

1. A system for automatically generating test solutions, comprising:
    simulation circuitry switchably coupled to a selected analog cell having a port for applying analog tests;
    a bus coupled with the simulation circuitry and operative to transmit and receive analog test simulation data;
    an test bench file configured to receive the simulation data;
    an output file operative to store the simulation data and deliver the simulation data to the simulation circuitry; and
    a test program generated by the simulation circuitry and the output file and configured to automatically generate test benches based upon chip-specific information; and
    an automatic analog test bench generator configured to receive the input file and communicating with the ATAP simulation circuitry;
    wherein the automatic analog test bench generator comprises an database including default cells each having pins to be connected to an instance of said port.

2. The system of claim 1 wherein the simulation circuitry comprises a test bench generated by an automatic analog test bench generator.

3. The system of claim 1 wherein the bus communicates between an analog test access port of an analog cell under test and the simulation circuitry.

4. The system of claim 1 wherein the test bench file comprises vectors that write values in registers of the port so as to set the respective cell into a defined state.

5. The system of claim 1 wherein the output file is further operative to deliver the simulation data to the test program.

6. An apparatus for generating a test program for analog components of an integrated circuit, comprising:
   simulation circuitry switchably coupled to a selected analog cell for applying analog tests, wherein the simulation circuitry comprises a test bench file, a wave file, and a timing file;
   a bus coupled with the simulation circuitry and operative to transmit and receive analog test simulation data;
   a test bench configured to receive the simulation data;
   an output file operative to store results of the simulation and deliver the results to the simulation circuitry; and
   a test program generated by the simulation circuitry and the output file and configured to automatically generate test benches based upon chip-specific information.

7. The apparatus of claim 6 wherein the output file comprises a test bench file.

8. The apparatus of claim 6 comprising an automatic analog test bench generator and an automatic analog test bench generator database storing descriptions of analog cells, each analog cell within the database including an analog test access port.

9. A method for generating a test bench, comprising:
   providing an integrated circuit having a cell containing an analog component and including an analog test access port;
   providing an automatic analog test bench generator wherein the automatic analog test bench generator includes a database of default cells;
   loading a cross-reference file;
   selecting tests required for cells in the cross-reference file by default; and
   generating a test bench.

10. The method of claim 9 wherein the cross-reference file contains information on at least one of simulation parameters, signal names, and analog pins.

11. The method of claim 9 wherein the cell is an analog cell.

12. The method of claim 9 wherein the cell is a mixed-signal cell.

13. The method of claim 9 wherein the automatic analog test bench generator is used to generate the test bench.

14. The method of claim 9 further comprising the step of rendering a simulation with the test bench of an integrated circuit having at least one analog cell.

15. The method of claim 14 wherein the rendered simulation generates a vector file and an output file.

16. The method of claim 15 wherein the vector file and the output file cooperate with the automatic analog test bench generator to generate a test program.

17. A method of automatically generating analog cell test solutions for mixed signal products, comprising:
   providing an integrated circuit having an analog cell;
   providing an automatic analog test bench generator wherein the automatic analog test bench generator generates a wave file, and the test bench generates a timing file;
   providing a database of default cells including pin names;
   selecting a default cell from the database;
   coupling together a plurality of the selected cells into a series chain;
   identifying any pin names that are different from any pin names identified within the series chain of selected cells;
   selecting tests required for each selected cell; and
   filing an option panel with the selected cells and tests.

18. The method of claim 17 further comprising the steps of:
   generating a test bench with the automatic analog test bench generator; and
   rendering a simulation with the test bench of an integrated circuit having at least one analog cell.

19. The method of claim 18 wherein the rendered simulation generates a vector file and an output file.

20. The method of claim 19 wherein the vector file and the output file cooperate with the automatic analog test bench generator to generate a test program.

21. The method of claim 17 wherein each cell within the automatic analog test bench generator includes an analog test access port.

* * * * *